United States Patent
Hofstee et al.

(10) Patent No.: US 7,398,482 B2
(45) Date of Patent: Jul. 8, 2008

(54) MODULAR DESIGN METHOD AND APPARATUS

(75) Inventors: Harm Peter Hofstee, Austin, TX (US); James Allan Kahle, Austin, TX (US); Takeshi Yamazaki, Kanagawa (JP)

(73) Assignee: International Business Machines Corporation, Armonk, NY (US)

( * ) Notice: Subject to any disclaimer, the term of this patent is extended or adjusted under 35 U.S.C. 154(b) by 378 days.

(21) Appl. No.: 11/191,580

(22) Filed: Jul. 28, 2005

(65) Prior Publication Data

US 2007/0052562 A1    Mar. 8, 2007

(51) Int. Cl.
G06F 17/50    (2006.01)
(52) U.S. Cl. .................... 716/1; 716/5; 716/16
(58) Field of Classification Search .............. 716/1, 716/4–5, 16–18
See application file for complete search history.

(56) References Cited

U.S. PATENT DOCUMENTS

| | | |
|---|---|---|
| 2002/0073380 A1* | 6/2002 | Cooke et al. .................... 716/1 |
| 2002/0074668 A1 | 6/2002 | Hofstee et al. |
| 2002/0078270 A1 | 6/2002 | Hofstee et al. |
| 2002/0078285 A1 | 6/2002 | Hofstee et al. |
| 2002/0078308 A1 | 6/2002 | Altman et al. |
| 2002/0138707 A1 | 9/2002 | Suzuoki et al. |
| 2002/0156993 A1 | 10/2002 | Suzuoki et al. |
| 2005/0071800 A1* | 3/2005 | Liu .............................. 716/18 |
| 2007/0180413 A1* | 8/2007 | Park .............................. 716/5 |

* cited by examiner

Primary Examiner—Paul Dinh
(74) Attorney, Agent, or Firm—Carr LLP; D'Ann Rifai

(57) ABSTRACT

Disclosed is a procedure or design approach for functional modules that may be used in connection with a multiprocessor integrated circuit chip. The approach includes keeping the dimensions of each module substantially the same and having the bus, power, clock and I/O connection configured the same on all modules. Further requirements for ease of use are to generalize the capability of each module as much as possible and to decentralize functions such as testing to be primarily performed within each module. The use of such considerations or rules substantially eases the design of a given type of custom chips, and based upon an initial chip design greatly facilitates the design of further custom chips, similar in application, but subsequent to the successful completion of the initial chip. The standardization modules and replication of the modules on a given chip also reduces physical verification time in initial chip design as well as redesign time of the initial chip when requirements for chip capability are redefined or otherwise changed. Any subsequent or further custom chips can include more or less of specific modules based upon already established parameters.

8 Claims, 3 Drawing Sheets

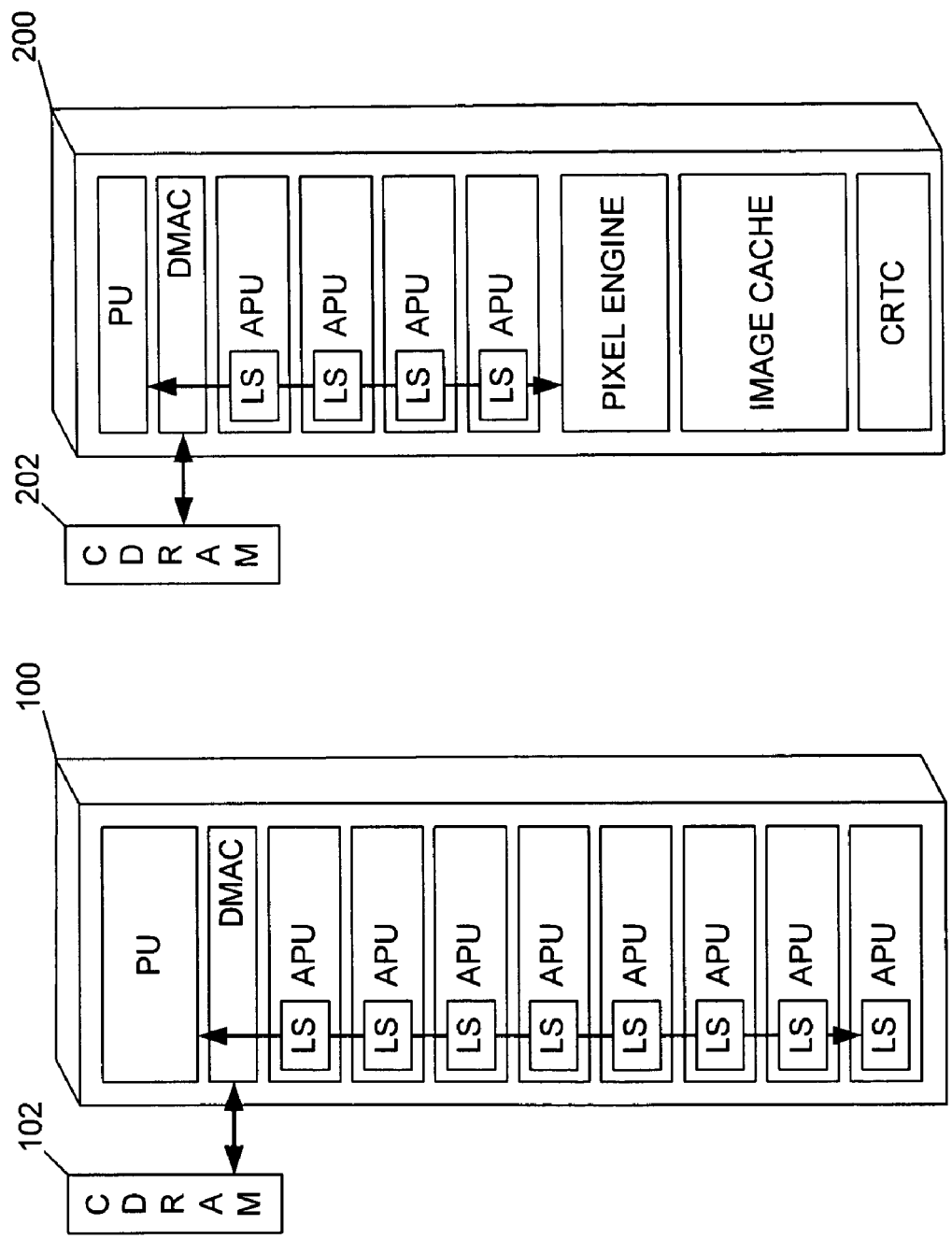

MODULAR DESIGN METHOD AND APPARATUS

TECHNICAL FIELD

The invention relates to the design of integrated circuit processor chips.

BACKGROUND

Normally, when a multiprocessor chip is required for a new application, a new set of functions or greater functionality for a prior application, a significant amount of effort is required to accomplish the design of the new chip. In other words, even though a new chip has components having the same general types of functionality as existing multiprocessor chips, the numbers of various components may change. As an example, for a given application, a multiprocessor chip may need considerable RAM (random access memory) and minimal cache or floating point math capability. In another application, either the cache or floating point math capability may be to be expanded and RAM is not as important. In other applications, the functionality may be primarily directed to media applications.

It would be desirable to formulate a set of design rules to initially create the various functional modules of a given or first chip whereby this first or existing modular chip design may be used to create a new chip using more or less of the modules utilized in creating the existing chip in a substantially non-creative add or subtract process. Such standardization of modules would minimize chip redesign time in the event that it is determined that more or less capability is required for a given application. Further, the mandatory physical verification time required in conjunction with chip design procedures is substantially reduced upon the completion of physical verification of one of a plurality of replicated modules of a given functionality.

SUMMARY OF THE INVENTION

The present invention comprises utilizing a basic modular chip design constructed in accordance with a set of rules whereby a custom chip can be easily constructed by adding or subtracting modules from the basic design to obtain a finished product.

BRIEF DESCRIPTION OF THE DRAWINGS

For a more complete understanding of the present invention, and its advantages, reference will now be made in the following Detailed Description to the accompanying drawings, in which:

FIG. 1 is a block diagram representing some of the major components of a multiprocessor PE (processing element);

FIG. 2 is a block diagram representing some of the major components of a multiprocessor PE configured as a Graphics Synthesizer;

DETAILED DESCRIPTION

In the remainder of this description, a PE (processor element) will contain a processing unit (PU) that will typically be associated with and used to control the operation of a plurality of APUs (attached or assisting processor units) for a multiprocessor operation. Each APU may include LS (local storage) and other internal components such as floating point processing capability. The PE will also typically include a DMAC (direct memory access controller) and will be connected in some manner to memory. This memory may take various forms, such as SRAM (static random access memory), CDRAM (custom dynamic random access memory), and so forth. In some manner, the PE will be connected to other elements and components through some type of I/O (input/output) interface. The other elements and components may include monitors, external memory, printers and so forth. A PE may be set up to only provide computations or it may provide other functions such as to operate as a GS (Graphics Synthesizer). When set up to operate as a GS, the PE may well include additional components, such as a pixel engine, an image cache and a CRTC (cathode ray tube controller). Each of these components mentioned above, such as a PU, APU, CRTC, Pixel engine, DMAC, and so forth, may be considered as a separate module utilized in the construction of an integrated circuit chip. For other applications, the components may include floating point arithmetic modules, DSP (digital signal processing) modules and FPGA (field programmable data array) modules, and so forth.

Further information on the types of multiprocessor chips designed in accordance with the teachings and rules presented in this document may be found in various U.S. patent applications, such as U.S. Ser. No. 09/815,544 filed Mar. 22, 2001 and which has also been published as US 2002/0138707 A1 filed Sep. 26, 2002. The teachings of this application are hereby incorporated by reference into this document.

In FIG. 1, a PE 100 is diagrammatically illustrated set up for computation and is shown communicating with memory 102.

In FIG. 2, a PE 200 is diagrammatically illustrated set up as a graphics synthesizer and is shown communicating with memory 202.

Figure 3:
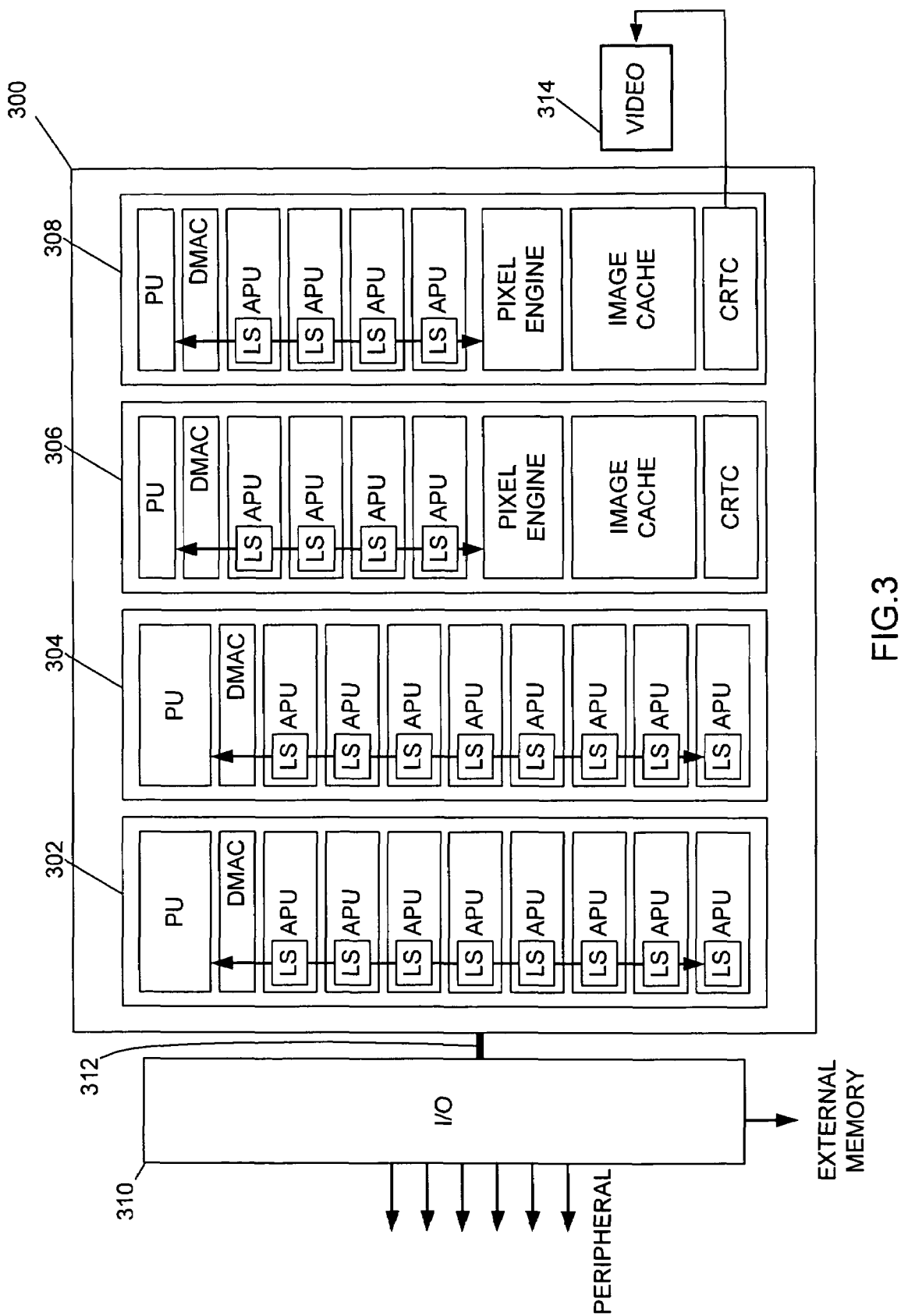
FIG. 3 is a block diagram of the major components comprising a large scale integrated circuit containing a plurality of PEs.

FIG. 3 shows a single chip 300 comprising four PEs 302, 304, 306 and 308. This chip 300 is connected to an I/O block 310 for communication with devices external to chip 300 by an off chip bus and is also connected separately to a video device 314.

Figure 4:
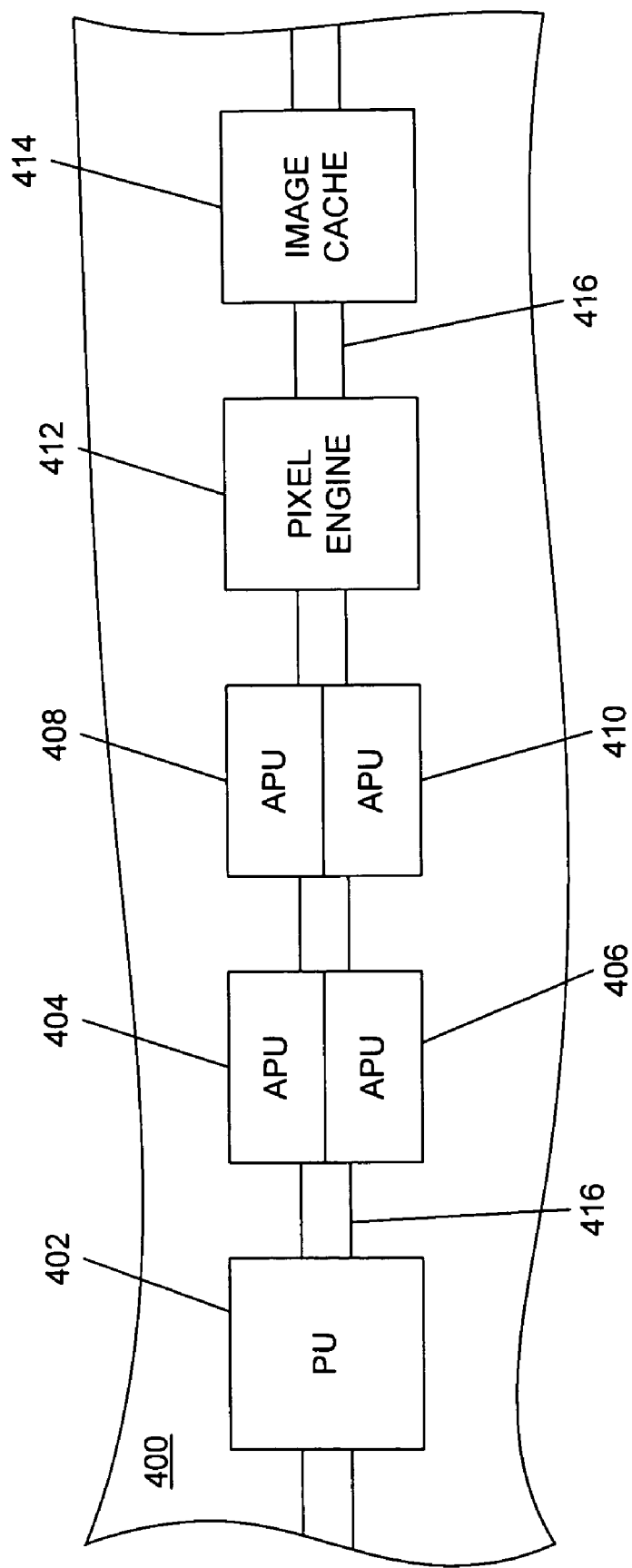
FIG. 4 is a simplified block diagram top view of a portion of a modular chip that is used in explaining the module approach used.

In FIG. 4, an illustrative top view of a portion of a chip 400 is shown having a PU module 402 mounted thereupon. A pair of APUs 404 and 406, comprising a module, are mounted side by side and next to PU 402. A like pair of APUs 408 and 410, comprising another module, are shown next to the APUs 404, 406. Next is shown a pixel engine module 412 and then an image cache module 414. Each of the modules is interconnected by a ring type bus 416. As shown, the bus 416 is connected to the middle portion of each of the modules and thus can also provide a set of connections to each of the APUs. The portion of the chip shown in FIG. 4 comprises a majority of the components or modules required to accomplish the graphics function illustrated in FIG. 2. The illustration of FIG. 4 is not intended to present a complete PE, but rather is used to explain the process used to design a modular multiprocessor in accordance with the present invention. Among those portions not shown is a memory access controller that connects bus 416 to external memory. Also not shown, but an item that is common to integrated circuit chips, is a clock mesh that would be laid over the components shown for supplying clock signals to each of the modules. Further, there would be power mesh used to supply power to each of the modules. An off chip bus 312 would be used to communicate with external devices via an I/O controller, such as shown by block 310 in FIG. 3. Each of the power and communication meshes mentioned above would, in accordance with the rules stated infra, be connected to each of a majority of the modules in an identical fashion even though their functionality may be completely different. In this manner, the same mesh, such as the communication bus mesh, clock or power mesh may connect to a module in a given physical position on the chip regardless of the functionality of the module.

The design approach used in designing a multiprocessor chip, such as 300, in accordance with this invention, follows several standardized rules. One already mentioned is that each of the modules is designed to be substantially the same size in at least one dimension, such as width. Since an APU requires substantially less volume than does other components, such as the PU module, and further since many APUs are typically used in a PE, two APUs were designed side by side in a single module in a manner that both sides may connect to bus 416. Any modules such as 402, 412 and 414 that provided a single total function were constructed whereby the connections to the bus were located in the same relative position of the module. Thus a second rule is that all modules have communication bus, power, clock, testing and any other electrical connections in the same relative position of the module. In situations where a module is designed to contain two completely different functions, both side portions are designed to connect to a common bus. Another rule may be that all modules incorporate self testing logic and that the results of that testing be output in the same manner for all modules. In other words, component testing is decentralized, as a further rule, even though all the data may be collected by a single bus or set of paths on a common bus. Another rule followed in the design of processor component modules of this system was to make the processors very generalized in capability. In other words, an APU should be able to do everything well rather than worry about the processor being able to perform a single function better than other processors. Obviously the set of rules presented thus far is not exhaustive but merely exemplary of the process whereby each module of each PE should be as much like all other modules in the PE as possible as concerns size and interconnections to other modules and other commonly used circuitry, such as power, clock, testing and communications. Further, each module should be generalized as much as possible such that the fewest different types of modules may be used.

With the above set of rules or parameters in mind, it may be apparent that once a given chip like 300 is designed, a customized chip may be easily generated having only computation PEs like 302 or graphics capability PEs like 306. Further, the number of PEs on a given chip may readily be reduced to two or increased to eight. Further, if it was desired to reduce the number of APUs for a PE from eight to six, such a subtraction may be readily accomplished by eliminating one APU module for each PE required on the chip. Since, in a preferred embodiment, all modules communicate with one another or with memory by a ring bus, such as 416, such an alteration in design will merely reduce the number of modules communicating.

In summary, the present invention comprises designing a multiprocessor chip in a modular manner whereby each module communicates to other modules on the chip and to external devices in a substantially identical manner and the bus and signal mesh connections for each module are designed and configured in accordance with an identical standard. Using such a set of rules will allow the design of similar but custom chips to increase or decrease the number of modules on a specific custom designed chip without any further design for the individual modules and further will greatly reduce the design time for the custom chip since the same rules of connection and mechanical construction will apply as was used for the parent chip. It will be even simpler to merely scale the chip up or down if the only change is to increase or decrease the number of modules on the chip. As previously mentioned, the standardization of modules will greatly minimize any given chip redesign time in the event that it is determined that more or less capability is required for a given application. Further, the mandatory physical verification time required in conjunction with chip design procedures is substantially reduced upon the completion of physical verification of one of a plurality of replicated modules of a given functionality.

Although the invention has been described with reference to a specific embodiment, the description is not meant to be construed in a limiting sense. Various modifications of the disclosed embodiment, as well as alternative embodiments of the invention, will become apparent to persons skilled in the art upon reference to the description of the invention. It is therefore contemplated that the claims will cover any such modifications or embodiments that fall within the true scope and spirit of the invention.

What is claimed is:

1. A method for providing a variable and scalable modular multiprocessor design for providing custom designed chips while avoiding redesign of modules comprising the design, said method comprising:

generating a multiprocessor chip design comprised of one or more processing unit (PU) modules and a plurality of assisting processing unit (APU) modules wherein said one or more PU modules control said APU modules and wherein said one or more PU modules and APU modules are designed in accordance with one or more rules establishing common parameters wherein at least one dimension of said one or more PU modules and APU modules is defined in said rules as a standard;

selecting said one or more PU modules and APU modules to be removed and/or added from said multiprocessor chip design; and configuring said multiprocessor chip design comprised of said selected one or more PU modules and APU modules and a clock and power mesh positioned on each of said one or more PU modules and said APU modules wherein said design further comprises locating module bus connections in a same relative position for each of said one or more PU modules and APU modules requiring bus connections and a performance monitor bus connected to each of said one or more PU modules and APU modules.

2. The method of claim 1, wherein said design further comprises a first plurality of DMA control modules, each associated with a different one of said first plurality of assisting processing modules.

3. The method of claim 1, wherein examples of said common parameters include module dimensions, signal and power connections utilized, generalized module functionality and signal and power connection configurations.

4. The method of claim 1 wherein the step of generating a second multiprocessor design further comprises inserting said assisting processing modules to achieve a given processor functionality.

5. The method of claim 1 further her comprising using replications of the standardized assisting processing modules whereby the checking of a given module for compliance with predefined rules minimizes requirements for physical verification of other modules of the same functionality.

6. A computer program product for providing a variable and scalable modular multiprocessor design for providing custom designed chips while avoiding redesign of modules comprising the design, the computer program product having a computer program embodied in a storage device, the computer program, when executed by a computer, performing a method comprising
    computer code for generating a multiprocessor chip design comprised of one or more processing unit (PU) modules and a plurality of assisting processing unit (APU) modules wherein said one or more PU modules control said APU modules and wherein said one ore more PU modules and APU modules are designed in accordance with one or more rules establishing common parameters wherein at least one dimension of said one or more PU modules and APU modules is defined in said rules as a standard;
    computer code for preselecting a number of said modules selecting said one or more PU modules and APU modules to be removed and/or added from said first designs multiprocessor chip design; and
    computer code for configuring said multiprocessor chip design comprised of said selected one or more PU modules and APU modules and a clock and power mesh positioned on each of said one or more PU modules and said APU modules wherein said design further comprises locating module bus connections in a same relative position for each of said one or more PU modules and APU modules requiring bus connections and a performance monitor bus connected to each of said one or more PU modules and APU modules.

7. The computer program product of claim 6, wherein said design further comprises a first plurality of DMA control modules, each associated with a different one of said first plurality of assisting processing modules.

8. The computer program product of claim 6 further comprising computer code for using replications of the standardized assisting processing modules whereby the checking of a given module for compliance with predefined rules minimizes requirements for physical verification of other modules of the same functionality.

* * * * *